(12) United States Patent
Lee et al.

(10) Patent No.: US 12,507,531 B2
(45) Date of Patent: Dec. 23, 2025

(54) DISPLAY APPARATUS HAVING A STORAGE CAPACITOR

(71) Applicant: LG Display Co., Ltd., Seoul (KR)

(72) Inventors: So Young Lee, Gumi-si (KR); Seung Kyeom Kim, Seoul (KR); Se Jong Seong, Seoul (KR)

(73) Assignee: LG Display Co., Ltd., Seoul (KR)

( * ) Notice: Subject to any disclaimer, the term of this patent is extended or adjusted under 35 U.S.C. 154(b) by 524 days.

(21) Appl. No.: 17/976,714

(22) Filed: Oct. 28, 2022

(65) Prior Publication Data

US 2023/0217712 A1    Jul. 6, 2023

(30) Foreign Application Priority Data

Dec. 31, 2021 (KR) ........................ 10-2021-0194724

(51) Int. Cl.
*H01L 29/08* (2006.01)
*H10D 86/40* (2025.01)
*H10D 86/60* (2025.01)
*H10K 59/121* (2023.01)
*H10K 59/122* (2023.01)
*H10K 59/131* (2023.01)

(52) U.S. Cl.
CPC ....... *H10K 59/1216* (2023.02); *H10D 86/441* (2025.01); *H10D 86/481* (2025.01); *H10D 86/60* (2025.01); *H10K 59/1213* (2023.02); *H10K 59/122* (2023.02); *H10K 59/131* (2023.02)

(58) Field of Classification Search
CPC ............. H10K 59/1216; H10K 59/131; H10K 59/122; H10K 59/1213; H10D 86/441; H10D 86/60; H10D 86/081

USPC .......................................................... 257/40
See application file for complete search history.

(56) References Cited

U.S. PATENT DOCUMENTS

| 10,581,031 | B2 | 3/2020 | Gunji |
| 2018/0090068 | A1 | 3/2018 | Ogawa et al. |
| 2019/0198582 | A1* | 6/2019 | Yeo ........................ H10K 59/88 |

FOREIGN PATENT DOCUMENTS

KR    20150060195 A  *  6/2015

OTHER PUBLICATIONS

Cite the machine translation Yoon S (KR-20150060195-A).*

* cited by examiner

*Primary Examiner* — Phuc T Dang
(74) *Attorney, Agent, or Firm* — Seed Intellectual Property Law Group LLP

(57) ABSTRACT

A display apparatus is provided. The display apparatus may include a light-emitting device disposed on an emission area of a device substrate. An over-coat layer may be disposed between the device substrate and the light-emitting device. The over-coat layer may include an over inclined surface extending along an edge of the emission area. A capacitor electrode may cover the over inclined surface. A first electrode of the light-emitting device may include a capacitor region overlapping with the capacitor electrode. A capacitor insulating layer may be disposed between the capacitor electrode and the capacitor region of the first electrode. Thus, in the display apparatus, an emission area may be increased, the light extraction efficiency may be improved, and color mixing may be prevented.

20 Claims, 7 Drawing Sheets

PA

DISPLAY APPARATUS HAVING A STORAGE CAPACITOR

CROSS-REFERENCE TO RELATED APPLICATIONS

This application claims the benefit of and priority to Korean Patent Application No. 10-2021-0194724, filed on Dec. 31, 2021, which is hereby incorporated by reference as if fully set forth herein.

BACKGROUND

Technical Field

The present disclosure relates to a display apparatus in which a storage capacitor is disposed in each pixel area.

Description of the Related Art

Generally, a display apparatus provides an image to user. For example, the display apparatus may include a plurality of pixel area. Each of the pixel areas may realize a specific color. For example, a light-emitting device may be disposed in each pixel area. The light-emitting device may emit light displaying a specific color. For example, the light-emitting device may include a light-emitting layer disposed between two electrodes.

A pixel driving circuit electrically connected to the light-emitting device may be disposed in each pixel area. The pixel driving circuit may supply a driving current corresponding to a data signal to the light-emitting device according to a gate signal. For example, the pixel driving circuit may include at least one thin film transistor. The driving current supplied by the pixel driving circuit may be maintained for one frame. For example, the pixel driving circuit may include a storage capacitor.

The light-emitting device and the pixel driving circuit of each pixel area may be supported by a device substrate. For example, light generated by the light-emitting device of each pixel may be emitted outside through the device substrate. However, in the display apparatus, the light emitted from the light-emitting device of each pixel area may be blocked by the pixel driving circuit of the corresponding pixel area. Thus, in the display apparatus, the light extraction efficiency may be decreased.

BRIEF SUMMARY

Accordingly, the present disclosure is directed to a display apparatus that substantially obviates one or more problems due to limitations and disadvantages of the related art.

A technical benefit of the present disclosure is to provide a display apparatus capable of improving the light extraction efficiency.

Additional advantages, benefits, and features of the disclosure will be set forth in part in the description which follows and in part will become apparent to those having ordinary skill in the art upon examination of the following or may be learned from practice of the disclosure. The benefits and other advantages of the disclosure may be realized and attained by the structures particularly pointed out in the written description and claims hereof as well as the appended drawings.

To achieve these benefits and other advantages and in accordance with the purpose of the present disclosure, as embodied and broadly described herein, there is provided a display apparatus comprising a device substrate. A bank insulating layer is disposed on the device substrate. The bank insulating layer defines an emission area. A light-emitting device is disposed on the emission area of the device substrate. The light-emitting device includes a first electrode, a light-emitting layer and a second electrode, which are sequentially stacked. An over-coat layer is disposed between the device substrate and the light-emitting device. The over-coat layer includes an over inclined surface extending along an edge of the emission area. A capacitor electrode is disposed between the over-coat layer and the bank insulating layer. The capacitor electrode covers the over inclined surface. A capacitor insulating layer is disposed between the capacitor electrode and the bank insulating layer. The capacitor insulating layer covers the capacitor electrode. The first electrode includes a capacitor region disposed between the capacitor insulating layer and the bank insulating layer.

The over inclined surface of the over-coat layer may have a positive taper shape.

A driving thin film transistor may be disposed between the device substrate and the over-coat layer. The capacitor electrode may be electrically connected to a gate electrode of the driving thin film transistor.

A lower passivation layer may be disposed between the driving thin film transistor and the over-coat layer. The capacitor electrode may penetrate the lower passivation layer to be connected to the gate electrode of the driving thin film transistor.

The first electrode may be electrically connected to a drain electrode of the driving thin film transistor at the outside of the capacitor electrode.

The capacitor electrode may have a reflectance higher than the first electrode.

A data line may be disposed outside the emission area. The capacitor electrode may be spaced away from a side of the emission area toward the data line.

A planar shape of the capacitor electrode may be a '⊏' shape.

The capacitor electrode may include a first conductive layer and a second conductive layer. The second conductive layer may be disposed on the first conductive layer. The second conductive layer may have a reflectance higher than the first conductive layer.

The second conductive layer of the capacitor electrode may be disposed outside the emission area.

The first conductive layer of the capacitor electrode and the capacitor insulating layer may extend to the inside of the emission area.

The emission area may be disposed between a power voltage supply line and a data line. An end portion of the first conductive layer may overlap the power voltage supply line. Another end portion of the first conductive layer may overlap the data line.

An encapsulation substrate may be disposed on the light-emitting device. A thermal conductivity of the encapsulation substrate may be higher than a thermal conductivity of the device substrate.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
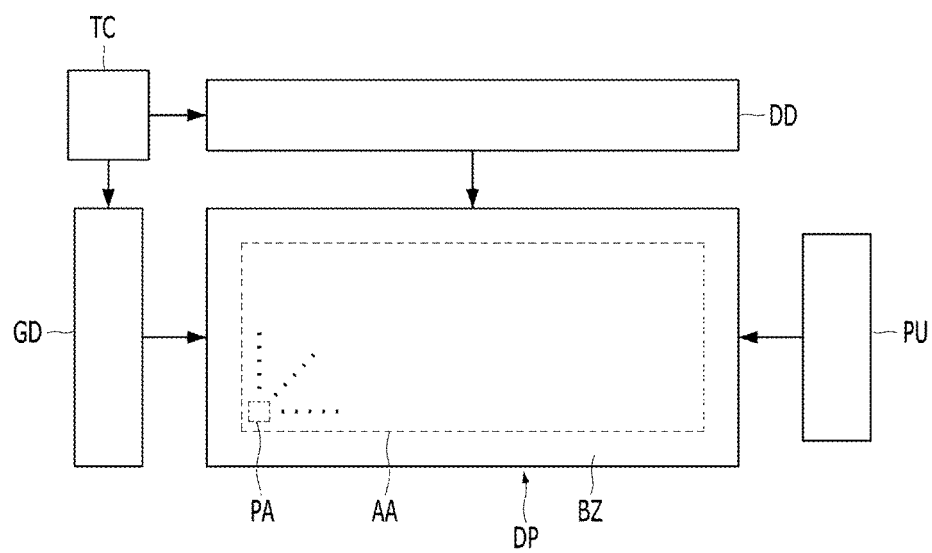
FIG. 1 is a view schematically showing a display apparatus according to an embodiment of the present disclosure.

Hereinafter, details related to the above benefits, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
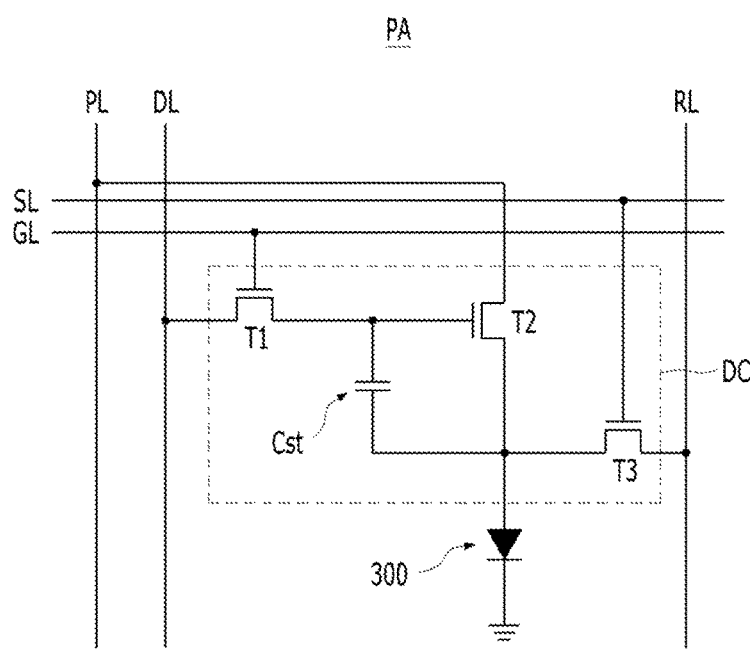
FIG. 2 is a view showing a circuit of a unit pixel area in the display apparatus according to the embodiment of the present disclosure.

FIG. 1 is a view schematically showing a display apparatus according to an embodiment of the present disclosure. FIG. 2 is a view showing a circuit of a unit pixel area in the display apparatus according to the embodiment of the present disclosure.

Referring to FIGS. 1 and 2, the display apparatus according to the embodiment of the present disclosure may include a display panel DP, a data driver DD, a gate driving GD, a timing controller TC and a power unit PU.

The display panel DP may generate an image being provided to a user. For example, the display panel DP may include a plurality of pixel area PA. The data driver DD, the gate driver GD, the timing controller TC and the power unit PU may provide a signal for the operation of each pixel area PA through signal lines DL, GL, SL, PL and RL. The signal lines DL, GL, SL, PL and RL may include data lines DL, gate lines GL, sensing lines SL, power voltage supply lines PL and reference voltage supply lines RL. For example, the data driver DD may apply a data signal to each pixel area PA through the data lines DL, and the gate driver GD may apply a gate signal to each pixel area PA through the gate lines GL. The gate driver GD may apply an initial signal to each pixel area PA through the sensing lines SL. The power unit PU may supply a power voltage to each pixel area PA through the power voltage supply lines PL, and supply a reference voltage to the each pixel area PA through the reference voltage supply lines RL. The timing controller TC may control the data driver DD and the gate driver GD. For example, the data driver DD may receive digital video data and a source timing control signal from the timing controller TC, and the gate driver GD may receive clock signals, reset clock signals and start signals from the timing controller TC.

Each of the pixel areas PA may realize a specific color. For example, each of the pixel area PA may include a pixel driving circuit DC and a light-emitting device 300 electrically connected to the pixel driving circuit DC. The pixel driving circuit DC may be electrically connected to the signal lines GL, DL, SL, PL and RL. For example, the pixel driving circuit DC may be electrically connected to one of the data lines DL, one of the gate lines GL, one of the sensing lines SL, one of the power voltage supply lines PL, and one of the reference voltage supply lines RL. The pixel driving circuit DC may supply a driving current corresponding to the data signal to the light-emitting device 300 for one frame according to the gate signal. For example, the pixel driving circuit DC may include a first thin film transistor (TFT) T1, a second thin film transistor (TFT) T2, a third thin film transistor (TFT) T3 and a storage capacitor Cst.

Figure 3:
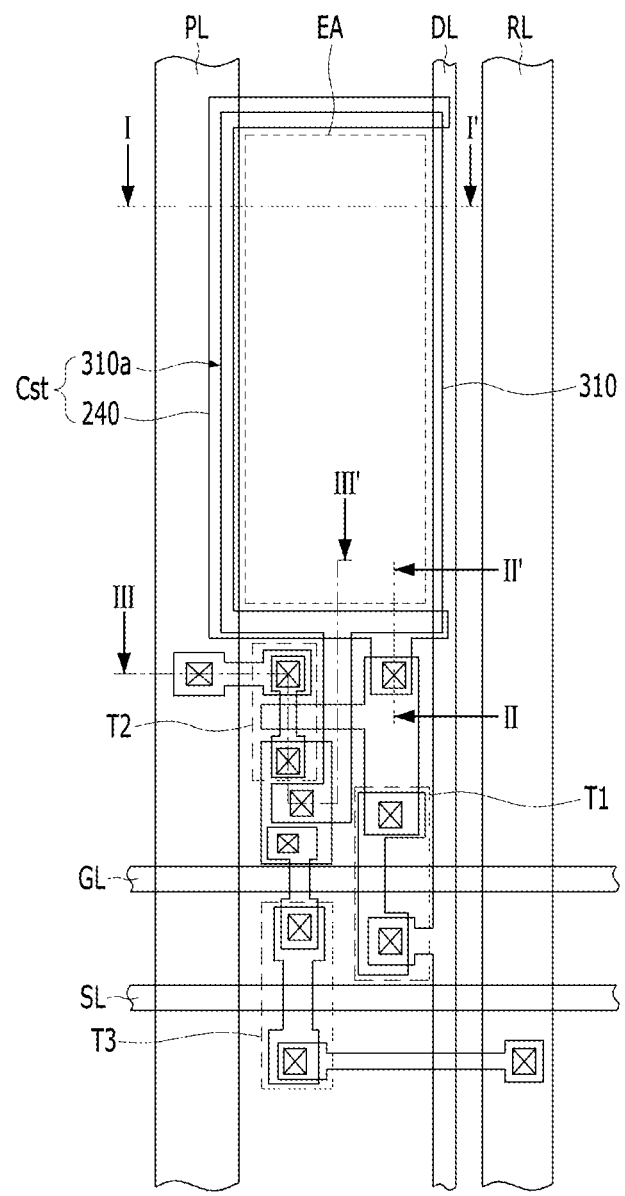
FIG. 3 is a view showing a planar shape of the unit pixel area in the display apparatus according to the embodiment of the present disclosure.
Figure 4:
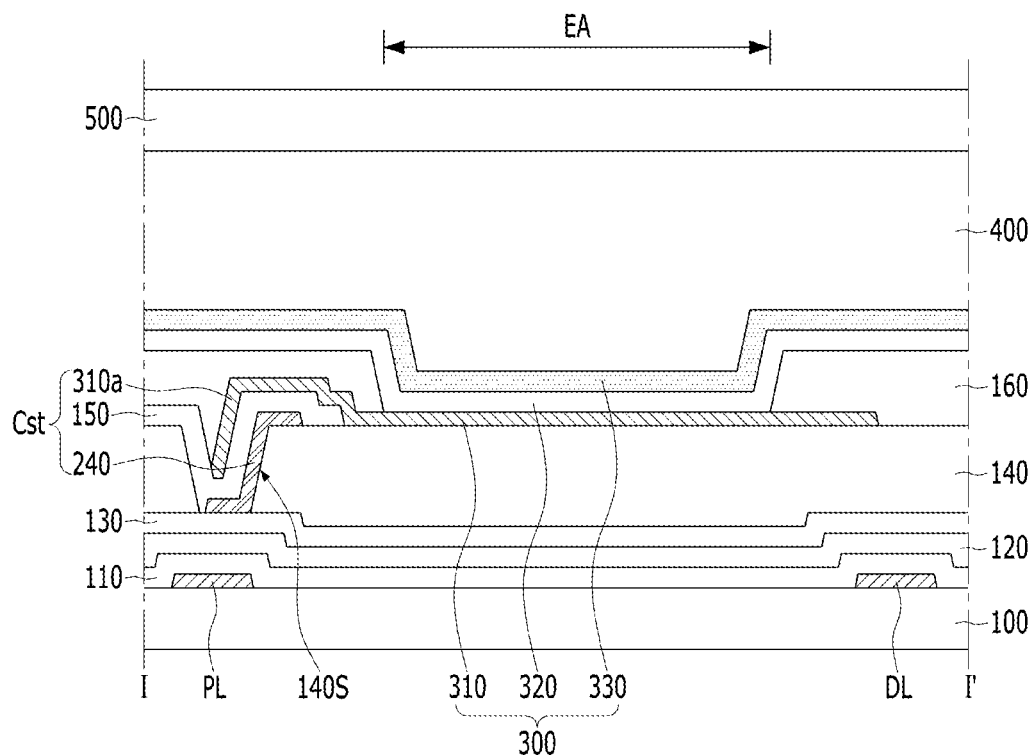
FIG. 4 is a view taken along I-I' of FIG. 3.
Figure 5:
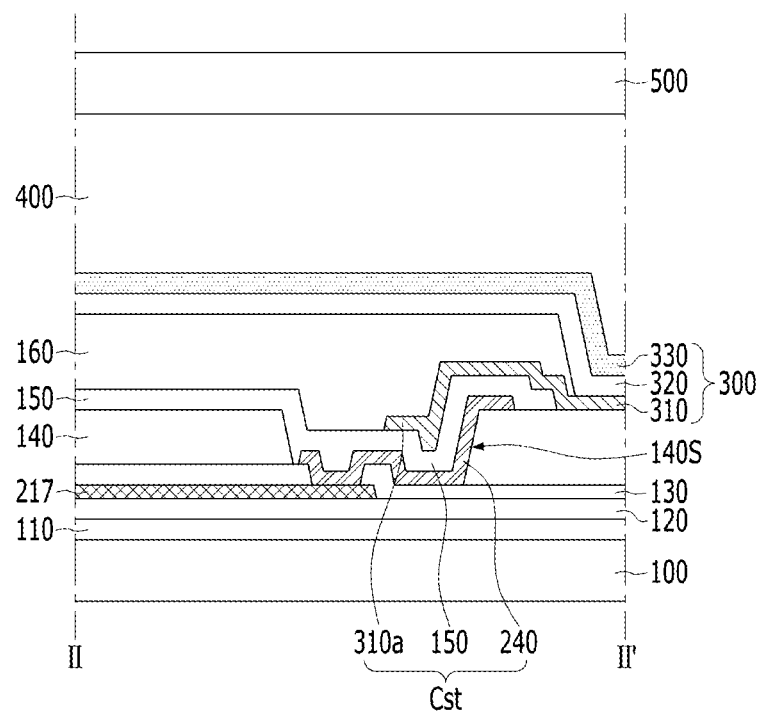
FIG. 5 is a view taken along II-II' of FIG. 3.
Figure 6:
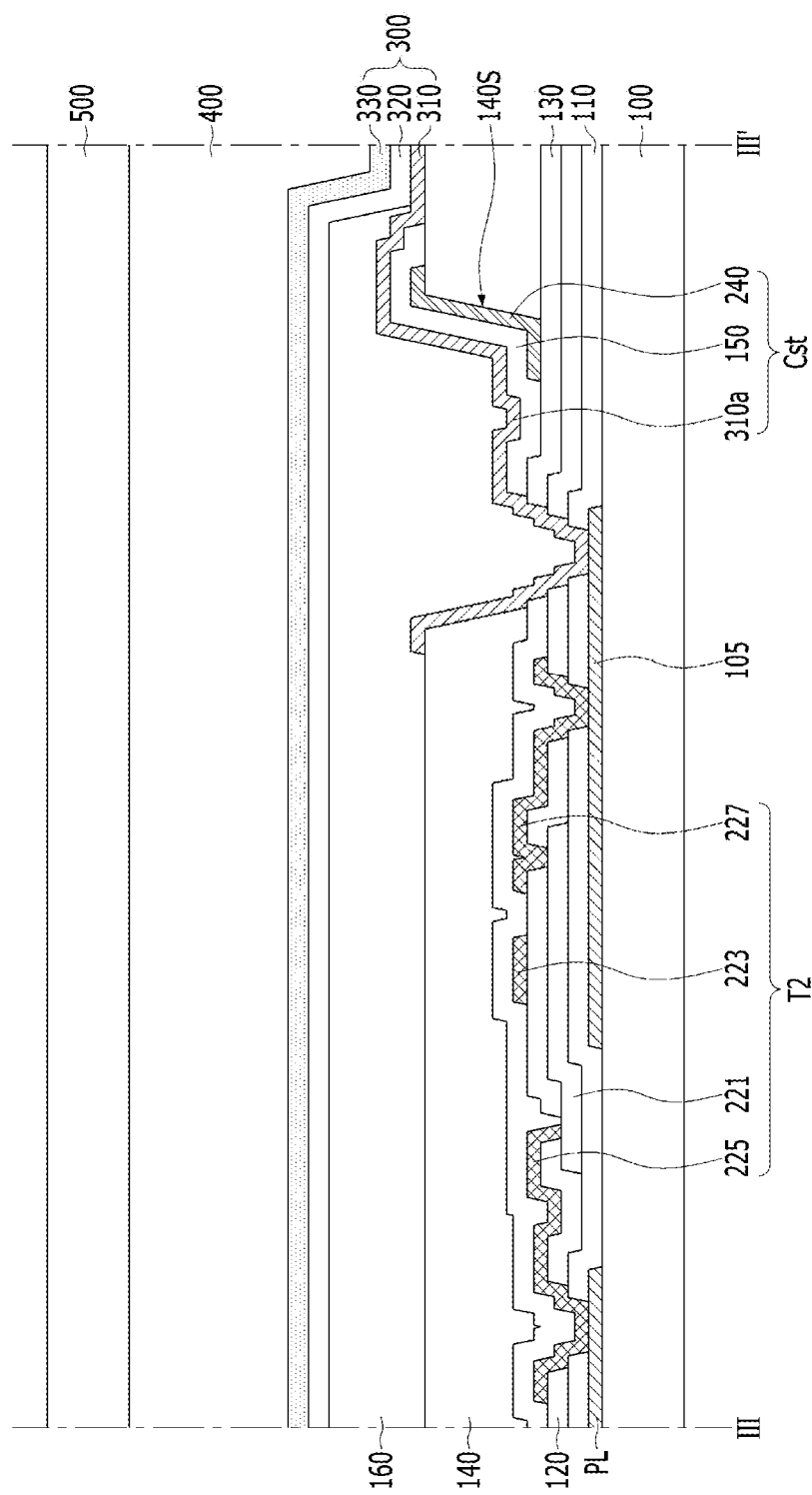
FIG. 6 is a view taken along III-III' of FIG. 3.

FIG. 3 is a view showing a planar shape of the unit pixel area in the display apparatus according to the embodiment of the present disclosure. FIG. 4 is a view taken along I-I' of FIG. 3. FIG. 5 is a view taken along II-II' of FIG. 3. FIG. 6 is a view taken along III-III' of FIG. 3.

Referring to FIG. 2 to FIG. 6, the first thin film transistor T1 may include a first semiconductor pattern, a first gate electrode, a first source electrode and a first drain electrode 217. The first thin film transistor T1 may transmit the data signal to the second thin film transistor T2 according to the gate signal. For example, the first gate electrode of the first thin film transistor T1 may be connected to one of the gate lines GL, and the first source electrode of the first thin film transistor T1 may be connected to one of the data lines DL.

The second thin film transistor T2 may include a second semiconductor pattern 221, a second gate electrode 223, a second source electrode 225 and a second drain electrode 227. The second thin film transistor T2 may generate the driving current corresponding to the data signal. For example, the second gate electrode 223 of the second thin film transistor T2 may be connected to the first drain electrode 217 of the first thin film transistor T1, and the second source electrode 225 of the second thin film transistor T2 may be connected to one of the power voltage supply lines PL. The light-emitting device 300 may be electrically connected to the second drain electrode 227 of the second thin film transistor T2. For example, the second thin film transistor T2 may be a driving thin film transistor which applies the driving current to the light-emitting device 300.

The first semiconductor pattern and the second semiconductor pattern 221 may include a semiconductor material. For example, the first semiconductor pattern and the second semiconductor pattern 221 may include an oxide semiconductor, such as IGZO. The second semiconductor pattern 221 may include the same material as the first semiconductor pattern. The second semiconductor pattern 221 may be disposed on the same layer as the first semiconductor pattern. For example, the second semiconductor pattern 221 may be formed simultaneously with the first semiconductor pattern.

Each of the first semiconductor pattern and the second semiconductor pattern 221 may include a source region, a channel region and a drain region. The channel region may be disposed between the source region and the drain region. The source region and the drain region may have a resistance lower than the channel region. For example, the source region and the drain region may include a conductorized region of an oxide semiconductor. The channel region may be a region of an oxide semiconductor, which may be not a conductorized region.

The first gate electrode and the second gate electrode 223 may include a conductive material. For example, the first gate electrode and the second gate electrode 223 may include a metal, such as aluminum (Al), chrome (Cr), copper (Cu), molybdenum (Mo), titanium (Ti) and tungsten (W). The second gate electrode 223 may include the same material as the first gate electrode. The second gate electrode 223 may be disposed on the same layer as the first gate electrode. For example, the second gate electrode 223 may be formed simultaneously with the first gate electrode.

The first gate electrode may be disposed on the first semiconductor pattern. For example, the first gate electrode may overlap the channel region of the first semiconductor pattern. The second gate electrode 223 may be disposed on the second semiconductor pattern 221. For example, the second gate electrode 223 may overlap the channel region of the second semiconductor pattern 221. The first gate electrode may be insulated from the first semiconductor pattern, and the second gate electrode 223 may be insulated from the second semiconductor pattern 221. For example, the channel region of the first semiconductor pattern may have an electric conductivity corresponding to a voltage applied to the first gate electrode, and the channel region of the second semiconductor pattern 221 may have an electric conductivity corresponding to a voltage applied to the second gate electrode 223.

The first source electrode, the first drain electrode 217, the second source electrode 225 and the second drain electrode 227 may include a conductive material. For example, the first source electrode, the first drain electrode 217, the second source electrode 225 and the second drain electrode 227 may include a metal, such as aluminum (Al), chrome (Cr), copper (Cu), molybdenum (Mo), titanium (Ti) and tungsten (W). The first drain electrode 217 may include the same material as the first source electrode. For example, the first drain electrode 217 may be disposed on the same layer as the first source electrode. The first drain electrode 217 may be formed simultaneously with the first source electrode. The second drain electrode 227 may include the same material as the second source electrode 225. For example, the second drain electrode 227 may be disposed on the same layer as the second source electrode 225. The second drain electrode 227 may be formed simultaneously with the second source electrode 225.

The first source electrode and the first drain electrode 217 may include the same material as the first gate electrode. For example, the first source electrode and the first drain electrode 217 may be disposed on the same layer as the first gate electrode. The first source electrode and the first drain electrode 217 may be formed simultaneously with the first gate electrode. The first source electrode and the first drain electrode 217 may be insulated from the first gate electrode. For example, the first source electrode and the first drain electrode 217 may be spaced away from the first gate electrode.

The second source electrode 225 and the second drain electrode 227 may include the same material as the second gate electrode 223. For example, the second source electrode 225 and the second drain electrode 227 may be disposed on the same layer as the second gate electrode 223. The second source electrode 225 and the second drain electrode 227 may be formed simultaneously with the second gate electrode 223. The second source electrode 225 and the second drain electrode 227 may be insulated from the second gate electrode 223. For example, the second source electrode 225 and the second drain electrode 227 may be spaced away from the second gate electrode 223.

The first source electrode may be electrically connected to the source region of the first semiconductor pattern. The first drain electrode 217 may be electrically connected to the drain region of the first semiconductor pattern. The second source electrode 225 may be electrically connected to the source region of the second semiconductor pattern 221. The second drain electrode 227 may be electrically connected to the drain region of the second semiconductor pattern 221. The second source electrode 225 and the second drain electrode 227 may include the same material as the first source electrode and the first drain electrode 217. For example, the second source electrode 225 and the second drain electrode 227 may be disposed on the same layer as the first source electrode and the first drain electrode 217. The second source electrode 225 and the second drain electrode 227 may be formed simultaneously with the first source electrode and the first drain electrode 217. The first source electrode, the first drain electrode 217, the second source electrode 225 and the second drain electrode 227 may be spaced away from each other.

The third thin film transistor T3 may include a third semiconductor pattern, a third gate electrode, a third source electrode and a third drain electrode. The third thin film transistor T3 may reset the storage capacitor Cst according to the initial signal. For example, the third gate electrode of the third thin film transistor T3 may be electrically connected to one of the sensing lines SL, the third source electrode of the third thin film transistor T3 may be connected to one of reference voltage supply lines RL.

The third semiconductor pattern may include a semiconductor material. For example, the third semiconductor pattern may include an oxide semiconductor, such as IGZO. The third semiconductor pattern may include the same material as the second semiconductor pattern 221. The third semiconductor pattern may be disposed on the same layer as the second semiconductor pattern 221. For example, the third semiconductor pattern may be formed simultaneously with the second semiconductor pattern 221. The third semiconductor pattern may have the same structure as the second semiconductor pattern 221. For example, the third semiconductor pattern may include a channel region between a source region and a drain region.

The third gate electrode may include a conductive material. For example, the third gate electrode may include a metal, such as aluminum (Al), chrome (Cr), copper (Cu), molybdenum (Mo), titanium (Ti) and tungsten (W). The third gate electrode may include the same material as the second gate electrode 223. The third gate electrode may be disposed on the same layer as the second gate electrode 223. For example, the third gate electrode may be formed simultaneously with the second gate electrode 223.

The third gate electrode may be disposed on the third semiconductor pattern. For example, the third gate electrode may overlap the channel region of the third semiconductor pattern. The third gate electrode may be insulated from the third semiconductor pattern. For example, the channel region of the third semiconductor pattern may have an electrical conductivity corresponding to a voltage applied to the third gate electrode.

The third source electrode and the third drain electrode may include a conductive material. The third drain electrode may include the same material as the third source electrode. The third drain electrode may be disposed on the same layer as the third source electrode. For example, the third drain electrode may be formed simultaneously with the third source electrode. The third drain electrode may include the same material as the second drain electrode 227. For example, the third source electrode and the third drain electrode may be formed simultaneously with the second source electrode 225 and the second drain electrode 227. The third source electrode and the third drain electrode may include the same material as the third gate electrode. The third source electrode and the third drain electrode may be spaced away from the first source electrode, the first drain electrode 217, the second source electrode 225 and the second drain electrode 227. The third source electrode may be electrically connected to the source region of the third semiconductor pattern. The third drain electrode may be electrically connected to the drain region of the third semiconductor pattern.

The first thin film transistor T1, the second thin film transistor T2 and the third thin film transistor T3 of each pixel area PA may be disposed on a device substrate 100. The device substrate 100 may include an insulating material. The device substrate 100 may include a transparent material. For example, the device substrate 100 may include glass or plastic.

At least one of insulating layers 110, 120, 130, 140 and 160 may be disposed on the device substrate 100 to prevent unnecessary connection between the pixel driving circuit DC and the light-emitting device 300 of each pixel area PA. For example, a device buffer layer 110, a gate insulating layer 120, a lower passivation layer 130, an over-coat layer 140 and a bank insulating layer 160 may be disposed on the device substrate 100.

The device buffer layer 110 may include an insulating material. For example, the device buffer layer 110 may include an inorganic insulating material, such as silicon oxide (SiO) and silicon nitride (SiN). The device buffer layer 110 may include a multi-layer structure. For example, the device buffer layer 110 may have a stacked structure of a layer made of silicon nitride (SiN) and a layer made of silicon oxide (SiO).

The device buffer layer 110 may be disposed between the device substrate 100 and the thin film transistors T1, T2 and T3 of each pixel area PA. The device buffer layer 110 may prevent pollution due to the device substrate 100 in a process of forming the thin film transistors T1, T2 and T3. For example, an entire surface of the device substrate 100 toward the thin film transistors T1, T2 and T3 of each pixel area PA may be covered by the device buffer layer 110.

A light-blocking pattern 105 may be disposed between the device substrate 100 and the device buffer layer 110. The light-blocking pattern 105 may prevent a characteristic's change of the thin film transistors T1, T2 and T3 in each pixel area PA due to external light. For example, the semiconductor pattern 221 of each thin film transistor T1, T2 and T3 may overlap the light-blocking pattern 105. The light-blocking pattern 105 may include a material capable of absorbing or reflecting the light. The light-blocking pattern 105 may include a conductive material. For example, the light-blocking pattern 105 may include a metal, such as aluminum (Al), chrome (Cr), copper (Cu), molybdenum (Mo), titanium (Ti) and tungsten (W).

The gate insulating layer 120 may include an insulating material. For example, the gate insulating layer 120 may include an inorganic insulating material, such as silicon oxide (SiO) and silicon nitride (SiN). The gate insulating layer 120 may include a material having a high dielectric constant. For example, the gate insulating layer 120 may include a High-K material, such as hafnium oxide (HfO). The gate insulating layer 120 may have a multi-layer structure.

The gate insulating layer 120 may be disposed on the device buffer layer 110. The gate insulating layer 120 may extend between the semiconductor pattern 221 and the gate electrode 223 of each thin film transistor T1, T2 and T3. For example, the gate insulating layer 120 may cover the first semiconductor pattern, the second semiconductor pattern 221 and the third semiconductor pattern of each pixel area PA. The first gate electrode, the second gate electrode 223 and the third gate electrode of each pixel area PA may be disposed on the gate insulating layer 120. For example, the gate electrode 223 of each thin film transistor T1, T2 and T3 may be insulated from the semiconductor pattern 221 of the corresponding thin film transistor T1, T2 and T3 by the gate insulating layer 120.

The first source electrode, the first drain electrode 217, the second source electrode 225, the second drain electrode 227, the third source electrode and the third drain electrode of each pixel area PA may be disposed on the gate insulating layer 120. For example, the gate insulating layer 120 of each pixel area PA may include a first source contact hole exposing the source region of the first semiconductor pattern, a first drain contact hole exposing the drain region of the first semiconductor pattern, a second source contact hole exposing the source region of the second semiconductor pattern 221, a second drain contact hole exposing the drain region of the second semiconductor pattern 221, a third source contact hole exposing the source region of the third semiconductor pattern, and a third drain contact hole exposing the drain region of the third semiconductor pattern.

The lower passivation layer 130 may include an insulating material. For example, the lower passivation layer 130 may include an inorganic insulating material, such as silicon oxide (SiO) and silicon nitride (SiN). The lower passivation layer 130 may be disposed on the gate insulating layer 120. The lower passivation layer 130 may prevent the damage of the thin film transistor T1, T2 and T3 in each pixel area PA due to external impact and moisture. For example, the gate electrode 223, the source electrode 225 and the drain electrode 217 and 227 of each thin film transistor T1, T2 and T3 may be covered by the lower passivation layer 130. The lower passivation layer 130 may extend along a surface of each thin film transistor T1, T2 and T3 opposite to the device substrate 100. For example, the lower passivation layer 130 covering the thin film transistors T1, T2 and T3 of each pixel area PA may be in direct contact with the lower passivation layer 130 covering the thin film transistors T1, T2 and T3 of adjacent pixel area PA.

The over-coat layer 140 may include an insulating material. The over-coat layer 140 may include a material different from the lower passivation layer 130. For example, the over-coat layer 140 may include an organic insulating material. The over-coat layer 140 may be disposed on the lower passivation layer 130. The over-coat layer 140 may remove a thickness difference due to the thin film transistors T1, T2 and T3 of each pixel area PA. For example, an upper surface of the over-coat layer 140 opposite to the device substrate 100 may be a flat surface.

The light-emitting device 300 of each pixel area PA may be disposed on the upper surface of the over-coat layer 140. The light-emitting device 300 may emit light realizing a specific color. For example, the light-emitting device 300 may include a first electrode 310, a light-emitting layer 320 and a second electrode 330, which are sequentially stacked on the upper surface of the over-coat layer 140. Thus, in the display apparatus according to the embodiment of the present disclosure, the characteristic's deviation due to the position difference of the light emitted from the light-emitting device 300 of each pixel area PA may be prevented.

The first electrode 310, the light-emitting layer 320 and the second electrode 330 of each pixel area PA may be sequentially stacked on the upper surface of the over-coat layer 140. For example, the first electrode 310 of each pixel area PA may be electrically connected to the second thin film transistor T2 of the corresponding pixel area PA by one of electrode contact holes penetrating the over-coat layer 140. Thus, in the display apparatus according to the embodiment of the present disclosure, the characteristic's deviation due to the position difference of the light emitted outside through the device substrate 100 may be prevented.

The first electrode 310 may include a conductive material. The first electrode 310 may have a high transmittance. For example, the first electrode 310 may be a transparent electrode made of a transparent conductive material, such as ITO and IZO.

The first electrode 310 of each pixel area PA may be electrically connected to the pixel driving circuit DC of the corresponding pixel area PA. For example, the first electrode 310 of each pixel area PA may penetrate the gate insulating layer 120, the lower passivation layer 130 and the over-coat layer 140. The first electrode 310 of each pixel area PA may be indirectly connected to the pixel driving circuit DC of the corresponding pixel area PA. For example, the first electrode 310 of each pixel area PA may be connected to the second drain electrode 227 of the corresponding pixel area PA through the light-blocking pattern 105. Thus, in the display apparatus according to the embodiment of the present disclosure, the degree of freedom for the configuration of each pixel area PA may be improved.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. For example, the second electrode 330 may have a reflectance higher than the first electrode 310. The transmittance of the second electrode 330 may be lower than the transmittance of the first electrode 310. For example, the second electrode 330 may include a metal, such as aluminum (Al) and silver (Ag). Thus, in the display apparatus according to the embodiment of the present disclosure, the light generated by the light-emitting layer 320 of each pixel area PA may be emitted outside through the first electrode 310 of the corresponding pixel area PA and the device substrate 100.

The bank insulating layer 160 may include an insulating material. For example, the bank insulating layer 160 may include an organic insulating material. The bank insulating layer 160 may include a material different from the over-coat layer 140.

The bank insulating layer 160 may be disposed on the over-coat layer 140. The first electrode 310 of each light-emitting device 300 may be insulated from the first electrode 310 of adjacent light-emitting device 300 by the bank insulating layer 160. For example, the bank insulating layer 160 may cover an edge of the first electrode 310 in each pixel area PA. Thus, in the display apparatus according to the embodiment of the present disclosure, the light-emitting device 300 of each pixel area PA may be independently controlled by the bank insulating layer 160. The light-emitting layer 320 and the second electrode 330 of each light-emitting device 300 may be stacked on a portion of the corresponding first electrode 310 exposed by the bank insulating layer 160. For example, the bank insulating layer 160 may define emission area EA.

The emission area EA of each pixel area PA defined by the bank insulating layer 160 may be not overlap with the pixel driving circuit DC of the corresponding pixel area PA. For example, the thin film transistors T1, T2 and T3 of each pixel area PA may be disposed outside the emission area EA of the corresponding pixel area PA. Thus, in the display apparatus according to the embodiment of the present disclosure, the light emitted from the light-emitting device 300 of each pixel area PA may be not blocked by the thin film transistors T1, T2 and T3 of the corresponding pixel area PA.

The light-emitting layer 320 of each light-emitting device 300 may be connected to the light-emitting layer 320 of adjacent light-emitting device 300. For example, the light-emitting layer 320 of each light-emitting device 300 may extend on the bank insulating layer 160. The light emitted from the light-emitting device 300 of each pixel area PA may display the same color as the light emitted from the light-emitting device 300 of adjacent pixel area PA. For example, the light-emitting layer 320 of each pixel area PA may generate white light.

A voltage applied to the second electrode 330 of each light-emitting device 300 may be the same as a voltage applied to the second electrode 330 of adjacent light-emitting device 300. For example, the second electrode 330 of each light-emitting device 300 may be electrically connected to the second electrode 330 of adjacent light-emitting device 300. The second electrode 330 of each light-emitting device 300 may include the same material as the second electrode 330 of adjacent light-emitting device 300. For example, the second electrode 330 of each light-emitting device 300 may be formed simultaneously with the second electrode 330 of adjacent light-emitting device 300. Thus, in the display apparatus according to the embodiment of the present disclosure, a process of forming the second electrode 330 of each light-emitting device 300 may be simplified.

The signal lines GL, DL, SL, PL and RL may be disposed between the device substrate 100 and the light-emitting device 300 of each pixel area PA. For example, the signal lines GL, DL, SL, PL and RL may be formed using a process of forming the thin film transistors T1, T2 and T3 in each pixel area PA. The gate lines GL and the sensing lines SL may intersect with the data lines DL, the power voltage supply lines PL and the reference voltage supply lines RL. For example, the gate lines GL and the sensing lines SL may be disposed on a layer different from the data lines DL, the power voltage supply lines PL and the reference voltage supply lines RL. The date lines DL may be disposed on the same layer as the power voltage supply lines PL and the reference voltage supply lines RL. For example, the data lines DL, the power voltage supply lines PL and the reference voltage supply lines RL may be disposed on the same layer as the light-blocking pattern 105, and the gate lines GL and the sensing lines SL may be disposed on the same layer as the gate electrode 223 of each thin film transistor T1, T2 and T3. The gate lines GL and the sensing lines SL may include the same material as the gate electrode 223 of each thin film transistor T1, T2 and T3, and the data lines DL, the power voltage supply lines PL and the reference voltage supply lines RL may include the same material as the light-blocking pattern 105. For example, the gate electrode 223 of each thin film transistor T1, T2 and T3 may be formed simultaneously with the gate lines GL and the sensing lines SL, and the data lines DL, the power voltage supply lines PL and the reference voltage supply lines RL may be formed simultaneously with the light-blocking pattern 105.

The over-coat layer 140 may include an over inclined surface 140s extending along an edge of the emission area EA defined in each pixel area PA by the bank insulating layer 160. For example, holes extending along the edge of the emission area EA in each pixel area PA may be formed in the over-coat layer 140. The over inclined surface 140s of the over-coat layer 140 may have a positive taper shape. For example, a straight distance between the over inclined surface 140s and the emission area EA may be increased as it approaches the device substrate 100.

A capacitor electrode 240 and a capacitor insulating layer 150 may be stacked on the over inclined surface 140s of the over-coat layer 140 in each pixel area PA. The capacitor electrode 240 may include a conductive material. The capacitor electrode 240 may include a material having a high reflectance. For example, the capacitor electrode 240 may include a metal, such as aluminum (Al), chrome (Cr), copper (Cu), molybdenum (Mo), titanium (Ti) and tungsten (W). The capacitor electrode 240 may be disposed outside the emission area EA. For example, the capacitor electrode 240 may be disposed between the over-coat layer 140 and the bank insulating layer 160.

The over inclined surface 140s of the over-coat layer 140 may be completely covered by the capacitor electrode 240. Thus, in the display apparatus according to the embodiment of the present disclosure, the light emitted from the light-emitting device 300 of each pixel area PA outward of the emission area EA defined in the corresponding pixel area PA may be reflected inward of the corresponding emission area EA by the capacitor electrode 240. Therefore, in the display apparatus according to the embodiment of the present disclosure, the light extraction efficiency may be improved. And, in the display apparatus according to the embodiment of the present disclosure, color mixing caused by mixing of the light emitted from each pixel area PA with the light emitted from adjacent pixel area PA may be prevented.

The capacitor insulating layer 150 may include an insulating material. For example, the capacitor insulating layer 150 may include an inorganic insulating material, such as silicon oxide (SiO) and silicon nitride (SiN). The capacitor insulating layer 150 may include a material having a high dielectric constant. For example, the capacitor insulating layer 150 may include a High-K material.

The capacitor insulating layer 150 may cover the capacitor electrode 240. For example, the capacitor insulating layer 150 may extend along the over inclined surface 140s of the over-coat layer 140. An end portion of the capacitor electrode 240 may be covered by the capacitor insulating layer 150. The capacitor insulating layer 150 may be spaced away from the emission area EA. For example, the capacitor insulating layer 150 may be surrounded by the bank insulating layer 160.

The first electrode 310 of each pixel area PA may include a capacitor region 310a overlapping with the capacitor electrode 240 of the corresponding pixel area PA. For example, the first electrode 310 of each pixel area PA may extend along a surface of the capacitor insulating layer 150 opposite to the device substrate 100. The first electrode 310 of each pixel area PA may be electrically connected to the second drain electrode 227 of the corresponding pixel area PA at the outside of the capacitor electrode 240. For example, the first electrode 310 of each pixel area PA may be electrically connected to the light-blocking pattern 105 by the electrode contact hole penetrating the device buffer layer 110, the gate insulating layer 120 and the lower passivation layer 130, and the capacitor electrode 240 and the capacitor insulating layer 150 of each pixel area PA may be disposed between the electrode contact hole and the emission area EA of the corresponding pixel area PA.

The capacitor electrode 240, the capacitor insulating layer 150 and the capacitor region 310a of the first electrode 310 in each pixel area PA may constitute the storage capacitor Cst of the pixel driving circuit DC in the corresponding pixel area PA. That is, in the display apparatus according to the embodiment of the present disclosure, a portion of the first electrode 310 in each pixel area PA may function as an electrode of the storage capacitor Cst in the corresponding pixel area PA. Thus, in the display apparatus according to the embodiment of the present disclosure, an area occupied by the pixel driving circuit DC in each pixel area PA may be reduced. And, in the display apparatus according to the embodiment of the present disclosure, the emission area EA defined in each pixel area PA may be increased. Therefore, in the display apparatus according to the embodiment of the present disclosure, a size of the emission area EA defined in each pixel area PA may be increased.

An encapsulation substrate 500 may be disposed on the second electrode 330 of each light-emitting device 300. The encapsulation substrate 500 may prevent the damage of the light-emitting devices 300 due to the external impact and moisture. For example, the encapsulation substrate 500 may include a material having a specific hardness or more. The encapsulation substrate 500 may include a material having relatively high thermal conductivity. For example, the encapsulation substrate 500 may include a metal, such as aluminum (Al), nickel (Ni) and iron (Fe). The thermal conductivity of the encapsulation substrate 500 may be higher than the thermal conductivity of the device substrate 100. Thus, in the display apparatus according to the embodiment of the present disclosure, the heat generated by the pixel driving circuit DC and the light-emitting device 300 of each pixel area PA may be dissipated through the encapsulation substrate 500. Therefore, in the display apparatus according to the embodiment of the present disclosure, the deterioration of the light-emitting layers 320 may be minimized.

The encapsulation substrate 500 may be attached on the device substrate 100 in which the light-emitting devices 300 are formed. For example, an encapsulating element 400 may be disposed in a space between the light-emitting devices 300 and the encapsulation substrate 500. The encapsulating element 400 may include an adhesive material. The encapsulating element 400 may include an insulating material. For example, the encapsulating element 400 may include an olefin based material. The encapsulating element 400 may have a relatively low water vapor transmission rate (WVTR). Thus, in the display apparatus according to the embodiment of the present disclosure, the penetration of the external moisture through the encapsulating element 400 may be prevented.

Accordingly, in the display apparatus according to the embodiment of the present disclosure, the over-coat layer 140 disposed between the device substrate 100 and each light-emitting device 300 may include the over inclined surface 140s extending along the edge of the emission area EA defined in each pixel area PA, the capacitor electrode 240 and the capacitor insulating layer 150 covering the capacitor electrode 240 may be stacked on the over inclined surface 140s of the over-coat layer 140, and the first electrode 310 of each pixel area PA may include the capacitor region 310a extending onto the capacitor insulating layer 150 in the corresponding pixel area PA. That is, in the display apparatus according to the embodiment of the present disclosure, the storage capacitor Cst of each pixel area PA may be constituted by the capacitor electrode 240 disposed on the over inclined surface 140s of the over-coat layer 140, the capacitor insulating layer 150 covering the capacitor electrode 240, and the capacitor region 310a of the first electrode 310 extending onto the capacitor insulating layer 150. Thus, in the display apparatus according to the embodiment of the present disclosure, the light extraction efficiency may be improved, the color mixing may be prevented, and the size of the emission area may be increased. Therefore, in the display apparatus according to the embodiment of the present disclosure, the quality of the image may be improved.

In the display apparatus according to the embodiment of the present disclosure, the over inclined surface 140s of each pixel area PA may not extend between the emission area EA of the corresponding pixel area PA and the data line DL. That is, the display apparatus according to the embodiment of the present disclosure, the capacitor electrode 240 of each pixel area PA may not extend between the emission area EA of the corresponding pixel area PA and the data line DL. For example, the capacitor electrode 240 may be spaced away from a side of the emission area EA toward the data line DL. Thus, in the display apparatus according to the embodiment of the present disclosure, the distortion of a voltage stored in the storage capacitor Cst in each pixel area PA due to the data signal applied by the data lines DL may be prevented. Therefore, in the display apparatus according to the embodiment of the present disclosure, the light extraction efficiency may be improved and the color mixing may be prevented, without damaging the image.

In the display apparatus according to another embodiment of the present disclosure, each of the pixel area PA may realize a specific color using a color filter. For example, the display apparatus according to another embodiment of the present disclosure may include color filters disposed between the lower passivation layer 130 and the over-coat layer 140. Each of the color filter may overlap the light-emitting device 300 of one of the pixel areas PA. For example, the color filter of each pixel area PA may be disposed on a path of the light emitted from the light-emitting device 300 in the corresponding pixel area PA. A thickness difference due to the color filter of each pixel area PA may be removed by the over-coat layer 140. Thus, in the display apparatus according to another embodiment of the present disclosure, the configuration of each pixel area PA for realizing the image of various colors may be simplified.

In the display apparatus according to another embodiment of the present disclosure, the pixel driving circuit DC of each pixel area PA may further include an auxiliary capacitor disposed between the thin film transistors T1, T2 and T3 of the corresponding pixel area PA. Thus, in the display apparatus according to another embodiment of the present disclosure, the size of the emission area EA defined in each pixel area PA may be maximized, and the pixel driving circuit DC of each pixel area PA may have a sufficient storage capacity. Therefore, in the display apparatus according to another embodiment of the present disclosure, the quality of the image may be effectively improved.

Figure 7:
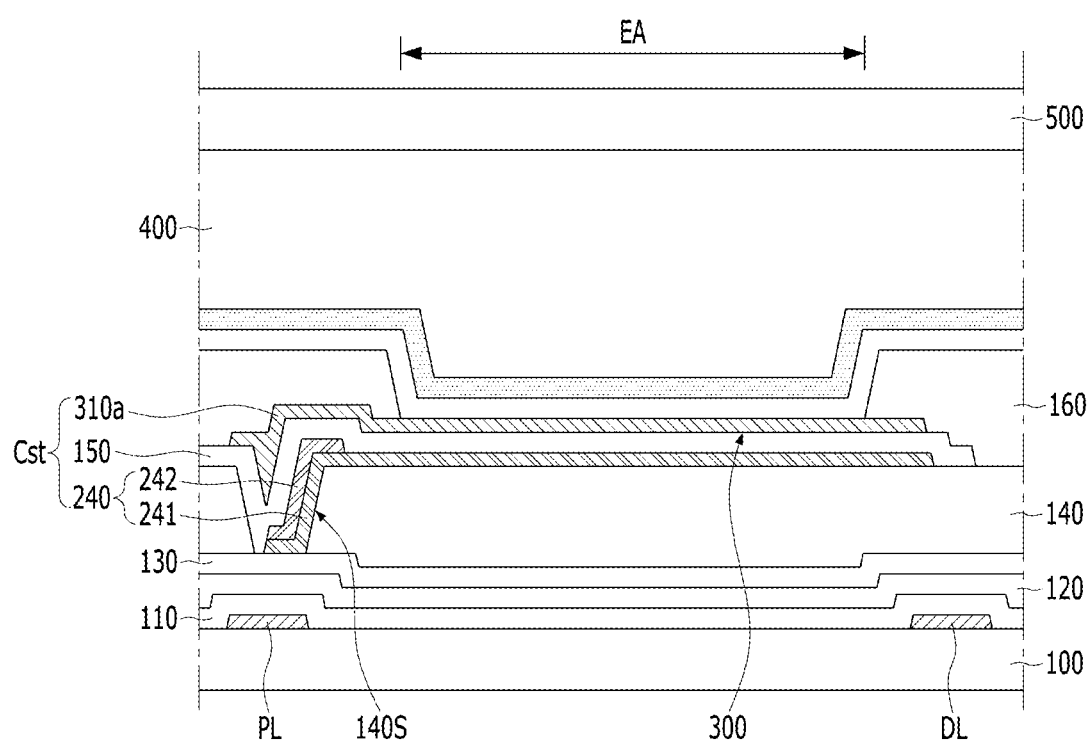
FIGS. 7 to 9 are views showing the display apparatus according to another embodiment of the present disclosure.
Figure 8:
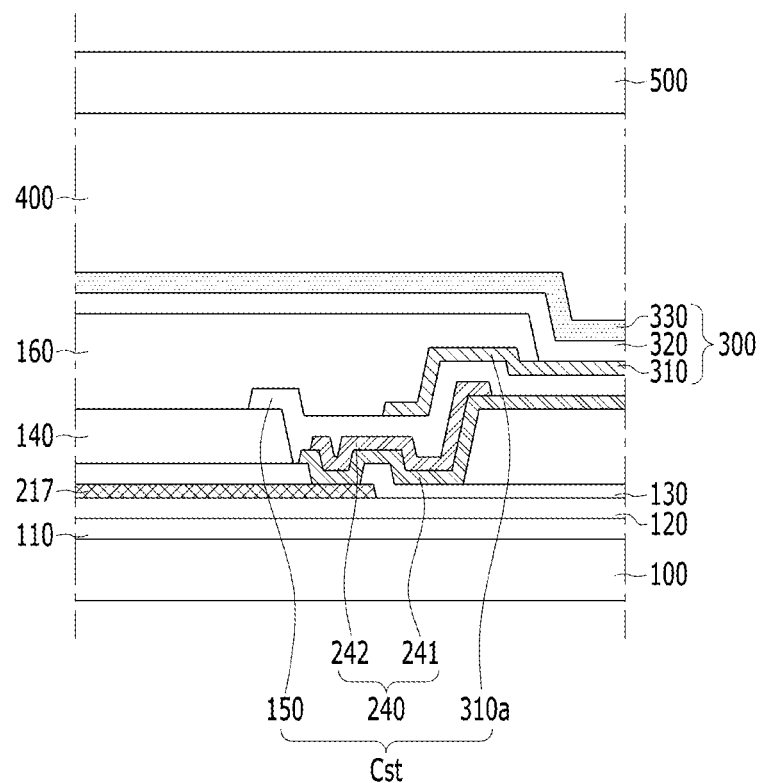
Figure 9:
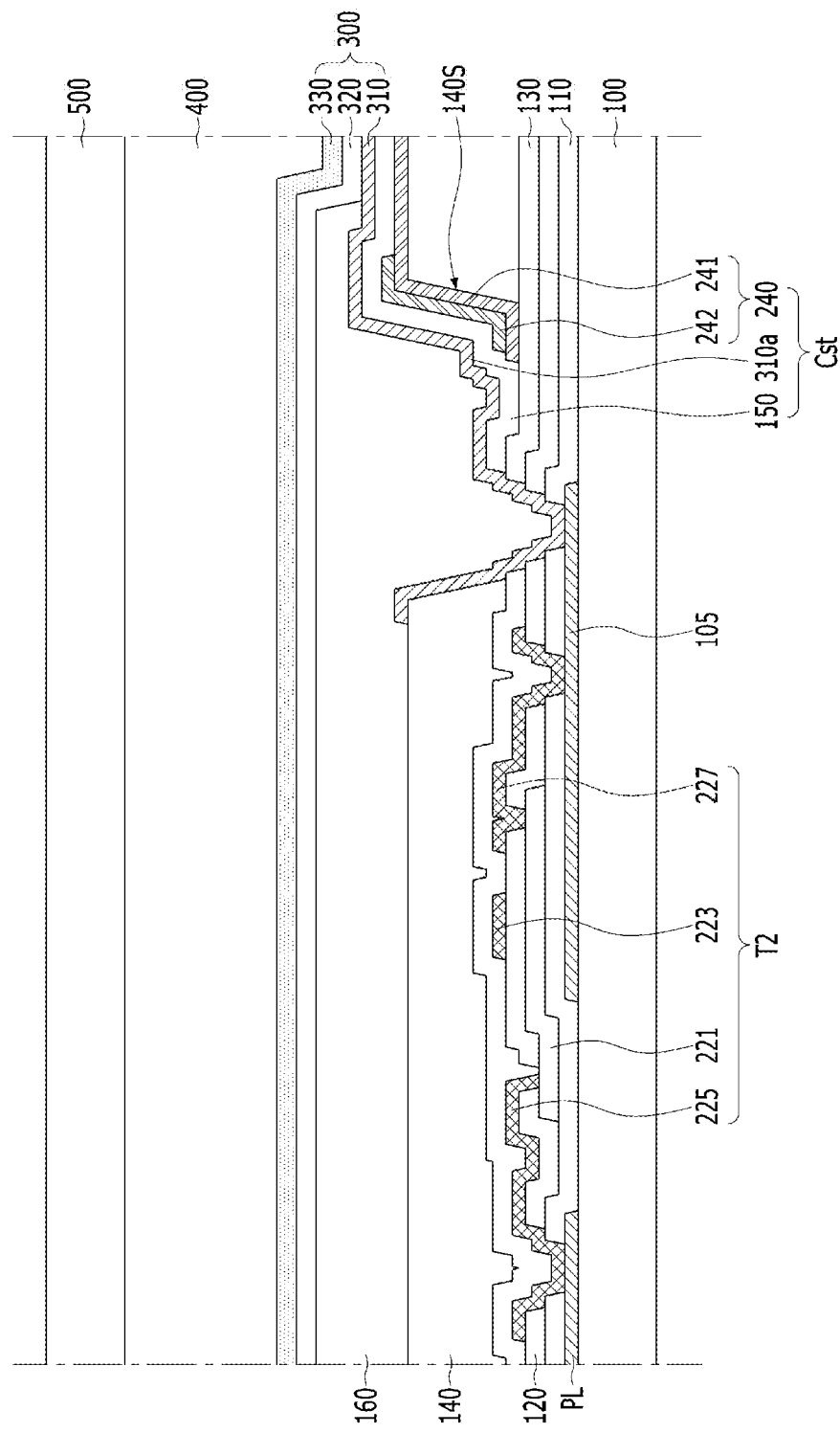

The display apparatus according to the embodiment of the present disclosure is described that the capacitor electrode 240 of each pixel area PA has a single-layer structure. However, in the display apparatus according to another embodiment of the present disclosure, the capacitor electrode 240 of each pixel area PA may have a multi-layer structure. For example, in the display apparatus according to another embodiment of the present disclosure, the capacitor electrode 240 of each pixel area PA may have a stacked structure of a first conductive layer 241 and a second conductive layer 242, as shown in FIGS. 7 to 9. The second conductive layer 242 may be in direct contact with the first conductive layer 241. The first conductive layer 241 may have a transmittance higher than the second conductive layer 242. For example, the first conductive layer 241 may be a transparent electrode made of a transparent conductive material, such as ITO and IZO. The second conductive layer 242 may have a reflectance higher than the first conductive layer 241. For example, the second conductive layer 242 may include a metal. Thus, in the display apparatus according to another embodiment of the present disclosure, the degree of freedom for configuration of the capacitor electrode 240 may be improved.

The first conductive layer 241 and the capacitor insulating layer 150 may extend to the inside of the emission area EA. The first conductive layer 241 and the capacitor insulating layer 150 may completely cross the emission area EA. For example, an end portion of the first conductive layer 241 may overlap the power voltage supply line PL, and another end portion of the first conductive layer 241 may overlap the data line DL. Thus, in the display apparatus according to another embodiment of the present disclosure, the storage capacitor may be formed in the emission area EA by the first conductive layer 241, the capacitor insulating layer 150 and the first electrode 310. That is, in the display apparatus according to another embodiment of the present disclosure, a decrease in the luminance of each pixel area PA may be minimized, and the storage capacity of the pixel driving circuit DC in the corresponding pixel area PA may be increased. Therefore, in the display apparatus according to another embodiment of the present disclosure, the emission efficiency and the quality of the image may be effectively improved.

In the result, the display apparatus according to the embodiments of the present disclosure may comprise the over-coat layer disposed between the device substrate and the light-emitting device, the capacitor electrode disposed on a portion of the over-coat layer, and the capacitor insulating layer covering the capacitor electrode, wherein the over-coat layer may include the over inclined surface extending along an edge of the emission area defined by the bank insulating layer, wherein the capacitor electrode and the capacitor insulating layer may be disposed on the over inclined surface, and wherein the first electrode of the light-emitting device may include the capacitor region overlapping with the capacitor electrode between the capacitor insulating layer and the bank insulating layer. Thereby, in the display apparatus according to the embodiments of the present disclosure, the light extraction efficiency of each pixel area may be improved, and the color mixing may be prevented.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
   a bank insulating layer disposed on a device substrate, the bank insulating layer defining an emission area;
   a light-emitting device including a first electrode, a light-emitting layer and a second electrode, which are sequentially stacked on the emission area of the device substrate;
   an over-coat layer disposed between the device substrate and the light-emitting device, the over-coat layer including an over inclined surface extending along an edge of the emission area;
   a capacitor electrode disposed between the over-coat layer and the bank insulating layer, the capacitor electrode covering the over inclined surface; and
   a capacitor insulating layer disposed between the capacitor electrode and the bank insulating layer, the capacitor insulating layer covering the capacitor electrode,
   wherein the first electrode includes a capacitor region disposed between the capacitor insulating layer and the bank insulating layer, and
   wherein the capacitor insulating layer is in contact with the capacitor electrode and the capacitor region of the first electrode on an outside of the emission area, such that the capacitor region of the first electrode functions as an electrode of a storage capacitor.

2. The display apparatus according to claim 1, wherein the over inclined surface of the over-coat layer has a positive taper shape.

3. The display apparatus according to claim 1, further comprising a driving thin film transistor disposed between the device substrate and the over-coat layer,
   wherein the capacitor electrode is electrically connected to a gate electrode of the driving thin film transistor.

4. The display apparatus according to claim 3, further comprising a lower passivation layer disposed between the driving thin film transistor and the over-coat layer,
   wherein the capacitor electrode penetrates the lower passivation layer to be connected to the gate electrode of the driving thin film transistor.

5. The display apparatus according to claim 3, wherein the first electrode is electrically connected to a drain electrode of the driving thin film transistor at the outside of the capacitor electrode.

6. The display apparatus according to claim 1, wherein the capacitor electrode has a reflectance higher than the first electrode.

7. The display apparatus according to claim 1, further comprising a data line disposed outside the emission area,
   wherein the capacitor electrode is spaced away from a side of the emission area toward the data line.

8. The display apparatus according to claim 7, wherein a planar shape of the capacitor electrode is a 'ㅜ' shape.

9. The display apparatus according to claim 1, wherein the capacitor electrode includes a first conductive layer and a second conductive layer disposed on the first conductive layer, and
   wherein the second conductive layer has a reflectance higher than the first conductive layer.

10. The display apparatus according to claim 9, wherein the second conductive layer of the capacitor electrode is disposed outside the emission area.

11. The display apparatus according to claim 9, wherein the first conductive layer of the capacitor electrode and the capacitor insulating layer extend to the inside of the emission area.

12. The display apparatus according to claim 11, wherein the emission area is disposed between a power voltage supply line and a data line, and
   wherein an end portion of the first conductive layer overlaps the power voltage supply line, and another end portion of the first conductive layer overlaps the data line.

13. The display apparatus according to claim 1, further comprising an encapsulation substrate disposed on the light-emitting device,
   wherein a thermal conductivity of the encapsulation substrate is higher than a thermal conductivity of the device substrate.

14. A display apparatus, comprising:
an over-coat layer disposed above a substrate, the over-coat layer includes an over inclined surface;
a capacitor electrode disposed above the over-coat layer, the capacitor electrode covering at least a portion of the over inclined surface;
a capacitor insulating layer disposed above the capacitor electrode, the capacitor insulating layer covering the capacitor electrode;
a light-emitting device disposed above the capacitor insulating layer, the light-emitting device including a first electrode, a light-emitting layer and a second electrode; and
a bank insulating layer disposed above the first electrode, the bank insulating layer including a gap surrounding an emission area,
wherein the first electrode includes a capacitor region that at least partially overlaps with the capacitor electrode, and
wherein the capacitor insulating layer is in contact with the capacitor electrode and the capacitor region of the first electrode on an outside of the emission area, such that the capacitor region of the first electrode functions as an electrode of a storage capacitor.

15. The display apparatus of claim 14, wherein:
the capacitor insulating layer fully covers the capacitor electrode.

16. The display apparatus of claim 14, wherein:
the over inclined surface of the over-coat layer extends along an edge of the emission area.

17. The display apparatus of claim 14, wherein:
the over inclined surface of the over-coat layer has a positive taper shape.

18. A display apparatus, comprising:
a bank insulating layer arranged above a substrate, the bank insulating layer defining an emission area;
a light-emitting device including a first electrode, a light-emitting layer, and a second electrode;
an over-coat layer arranged between the substrate and the first electrode of the light-emitting device, the over-coat layer includes an inclined surface extending along an edge of the emission area;
a capacitor electrode arranged above the over-coat layer, wherein the capacitor electrode covers the inclined surface; and
a capacitor insulating layer positioned between the capacitor electrode and the first electrode,
wherein the capacitor insulating layer is in contact with the capacitor electrode and the capacitor region of the first electrode on an outside of the emission area, such that the capacitor region of the first electrode functions as an electrode of a storage capacitor.

19. The display apparatus of claim 18, wherein:
the inclined surface of the over-coat layer has a positive taper shape.

20. The display apparatus of claim 18, wherein:
the capacitor insulating layer completely covers the capacitor electrode.

* * * * *